United States Patent
Nakamura et al.

(10) Patent No.: US 6,727,147 B2
(45) Date of Patent: Apr. 27, 2004

(54) MOSFET FABRICATION METHOD

(75) Inventors: Toshiyuki Nakamura, Tokyo (JP); Hideaki Matsuhashi, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/164,609

(22) Filed: Jun. 10, 2002

(65) Prior Publication Data

US 2003/0228735 A1 Dec. 11, 2003

(51) Int. Cl.⁷ .......................................... H01L 21/8236
(52) U.S. Cl. ........................ 438/279; 438/162; 438/163; 438/270; 438/479; 438/517; 438/589; 257/77; 257/607; 257/612; 257/617
(58) Field of Search ............................... 438/149, 162, 438/163, 270, 279, 479, 517, 589; 257/77, 607, 612, 617

(56) References Cited

U.S. PATENT DOCUMENTS

| | | | |
|---|---|---|---|
| 6,075,259 A | * | 6/2000 | Baliga .......................... 257/77 |
| 6,210,998 B1 | * | 4/2001 | Son ............................. 438/162 |
| 6,228,691 B1 | * | 5/2001 | Doyle .......................... 438/149 |
| 6,429,055 B2 | * | 8/2002 | Oh .............................. 438/149 |

FOREIGN PATENT DOCUMENTS

JP          11-087336          3/1999

* cited by examiner

*Primary Examiner*—Hoai Ho
*Assistant Examiner*—Renee R. Berry
(74) *Attorney, Agent, or Firm*—Volentine Francos, PLLC

(57) ABSTRACT

An FET is fabricated on an SOI substrate by the following processes. Openings are formed in laminated layers of a pad oxide film of about 5–10 nm and an oxidation-resistant nitride film of about 50–150 nm at positions where device isolation regions are to be provided. The substrate is irradiated by an ion implantation apparatus with at least one of Ar ions and Si ions with an implantation energy of 40–50 keV, and a dose of $1 \times 10^{14}$ to $5 \times 10^{15}$ cm$^{-2}$. Field oxidation is then conducted to electrically separate adjacent devices. The regions of the substrate where the openings are formed become amorphous when irradiated, and the field oxidation is consequently enhanced. Hence, a thermal oxidation film having sufficient thickness can be obtained even at device isolation regions having isolation widths of 0.2 μm or less.

16 Claims, 4 Drawing Sheets

MOSFET FABRICATION METHOD

BACKGROUND OF THE INVENTION

1. Field of the Invention

The present invention relates generally to a method of fabricating a Metal Oxide Semiconductor Field Effect Transistor (MOSFET), and more particularly to a method of forming a field oxide film which provides hyperfine device isolation on a Silicon-on-Insulator (SOI) substrate by means of Local Oxidation of Silicon (LOCOS).

2. Description of the Related Art

With the recent remarkable progress in semiconductor devices, demand is increasing for an LSI on which both digital and analog circuits are mounted, and which performs at high speed and with reduced power consumption. To meet this demand, semiconductor devices are required to be integrated more densely. As the devices to be mounted increase in number, isolation regions must be narrower and smaller.

A conventional method of fabricating a MOSFET in an SOI substrate by means of LOCOS is illustrated in FIGS. 2A–2F, each of which schematically shows a cross-section of the MOSFET at a fabrication step. Descriptions of the steps are as follows:

a) A pad oxide film 52 of about 5–10 nm is deposited on an SOI substrate 51. Then an active nitride film 53 of about 50–150 nm is deposited on the pad oxide film 52 as an oxidation-resistant mask (see FIG. 2A).

b) Openings are formed in the laminated layers of the pad oxide film 52 and the active nitride film 53 at positions where field oxide films 54 are to be provided, by a conventional lithography technique (see FIG. 2B).

c) The field oxide films 54 are formed on the SOI substrate 51 by dry oxidation (a heat treatment conducted in a dry oxygen atmosphere) (see FIG. 2C).

d) The remaining portions of the active nitride film 53 and the pad oxide film 52 are removed (see FIG. 2D).

e) Gate electrodes 55 are provided by a conventional process for fabricating MOSFETs (see FIG. 2E).

f) $SiO_2$ side walls 57 are formed by first providing an $SiO_2$ film on the substrate and then etching back. Impurities are then introduced into the substrate by means of ion implantation to form source/drain regions 58. Finally, the impurities in the source/drain regions 58 are activated by RTA (rapid thermal annealing) and a MOSFET with low source/drain resistance is obtained (see FIG. 2F).

In the above-described conventional method, when the width of a field oxidation region (i.e., the distance between adjacent devices (Wi in FIG. 2B)) is reduced to 0.2 μm or less ("sub-quarter micron"), there arises a problem of insufficiency of an oxidation amount in the dry oxidation process and a resultant insufficiency in thickness of the thermal oxidation film. One of the reasons for this insufficiency in the oxidation amount is stress generated in the SOI substrate at the time of forming the openings for the field oxidation regions (in the step b).

To obtain a sufficient amount of oxidation, an oxidizing temperature may be increased and oxidizing time may be lengthened. However, thermal oxidation at a high temperature for a long time will cause stress in the whole SOI substrate (i.e., in the wafer). This stress may induce defects in crystals in the substrate or cause warping of the substrate. Thus, if the oxidation is conducted at high temperature for a long time to ensure a sufficient amount of oxidation in hyperfine isolation regions of about 0.2 μm, the amount of oxidation will be excessively increased at areas where the design rules are less strict (e.g., peripheral circuits); i.e., the device isolation regions at those areas may be relatively wide. The thickness of the silicon layer of the SOI substrate is thinner than the conventional silicon substrate (silicon wafer). For example, the typical thickness of the silicon layer of the SOI substrate is about several nm, while the typical thickness of the conventional silicon substrate is, for example, about 625 μm. Therefore, the increase of amount of oxidation may significantly cause stress in the peripheral circuit regions of the LSI, in particular, formed in the SOI, and thus cause increases in leakage currents, for example. Such effects may adversely affect the operating characteristics of the LSI which is formed on an SOI substrate.

SUMMARY OF THE INVENTION

In view of the aforementioned, an object of the present invention is to obtain a sufficient amount of oxidation, without changing oxidation conditions such as temperature or time, during forming of device isolation regions of 0.2 μm or less by thermal oxidation.

To achieve the above object, a first aspect of the present invention is a method of fabricating a MOSFET, the method comprising:

(a) preparing an SOI substrate;

(b) depositing an oxide film on the SOI substrate;

(c) depositing a nitride film on the oxide film;

(d) forming an opening in the nitride film and oxide film at a predetermined region, at which a device isolation region is to be formed, by lithography for exposing a surface of the SOI substrate;

(e) irradiating the substantially the entire area of the silicon substrate with Ar ions;

(f) forming a field oxide film by dry oxidation; and (g) removing remaining portions of the nitride film and the oxide film.

In a second aspect of the present invention, Si ions are used in place of the Ar ions in the first aspect.

A third aspect of the present invention is a method for fabricating a MOSFET, the method comprising:

(a) preparing an SOI substrate having a structure of silicon layer/buried oxide/substrate;

(b) depositing an oxide film on the SOI substrate;

(c) depositing a nitride film on the oxide film;

(d) forming an opening in the nitride film and oxide film at a predetermined region, at which a device isolation region is to be formed, by lithography for exposing a surface of the SOI substrate;

(e) irradiating substantially the entire area of the SOI substrate with at least one of Ar ions and Si ions for implanting the at least one of Ar ions and Si ions into the silicon layer of the SOI substrate in the vicinity of the surface exposed by the step of forming the opening, the nitride film and the oxide film serving as a mask;

(f) forming a field oxide film by dry oxidation; and (g) removing remaining portions of the nitride film and the oxide film.

In each aspect, the thickness of the oxide film is preferably about 5–10 nm, and the thickness of the oxidation-resistant nitride film provided on the oxide film is preferably about 50–150 nm. The ion implantation is preferably conducted at an implantation energy of 40–50 keV, and implantation dose of $1 \times 10^{14}$ to $5 \times 10^{15}$ $cm^{-2}$.

Through the ion implantation under these conditions, the regions of the substrate where the openings are formed become amorphous, while defects in the substrate at the regions where devices are to be mounted can be avoided. Therefore, the field oxidation is enhanced, and the thickness of the thermal oxidation film will be sufficient even at the device isolation regions having openings of 0.2 μm or less. Further, no harmful effects will be caused to the electric characteristics of the device.

DETAILED DESCRIPTION OF THE PREFERRED EMBODIMENTS

Figure 1A:
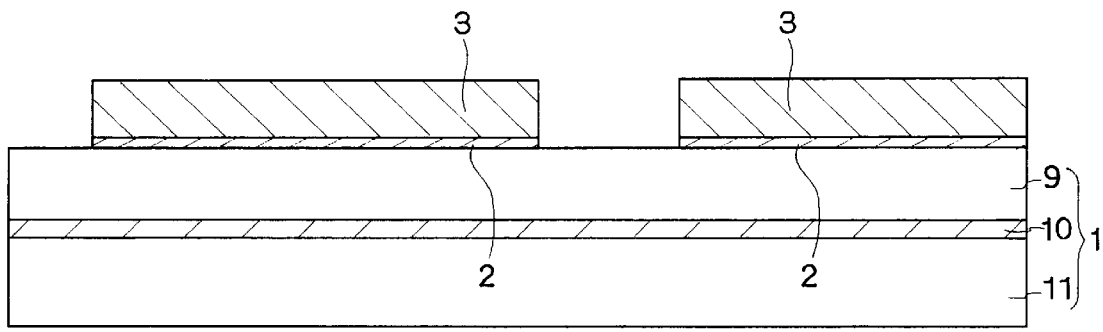
FIGS. 1A–1F illustrate a process for fabricating a semiconductor device of an embodiment of the present invention.

Embodiments of the present invention will be described in detail with reference to the drawings.

First Embodiment

Figure 1B:
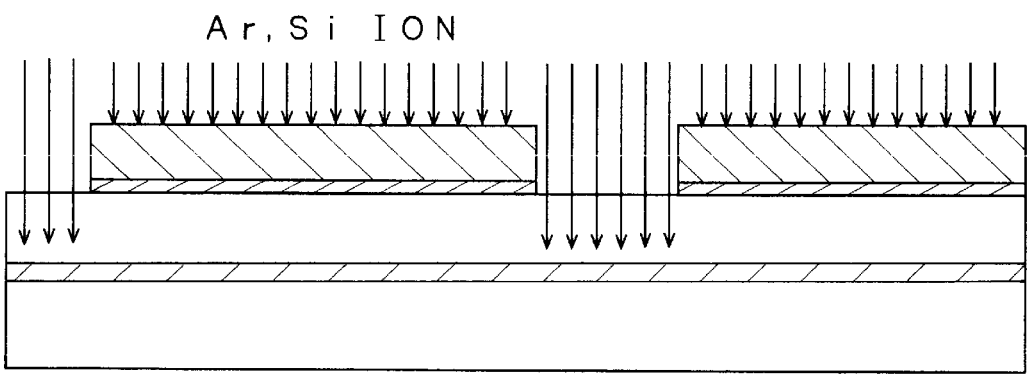

A first embodiment of the present invention is illustrated in FIGS. 1A–1F, each of which schematically shows a cross-section of a MOSFET at a fabrication step. Descriptions of the steps are as follows:

a) A pad oxide film 2 and an active nitride film 3, which is an oxidation-resistant mask, are deposited on an SOI substrate 1, which has a structure of silicon layer 9/buried layer 10/substrate 11, in the same manner as in the above-mentioned conventional method. The thickness of this silicon layer 9 is about 30–100 nm. Openings are then formed by known lithography at positions where field oxide films 4 are to be provided (see FIG. 1A).

b) The entire surface of the SOI substrate 1 on which the openings are formed is irradiated with Ar ions (see FIG. 1B). The irradiation is conducted by an ion implantation apparatus at, for example, an implantation energy of 40–50 keV, an implantation angle of 0°, and an implantation dose of $1 \times 10^{14}$ to $5 \times 10^{15}$ cm$^{-2}$.

Figure 1C:
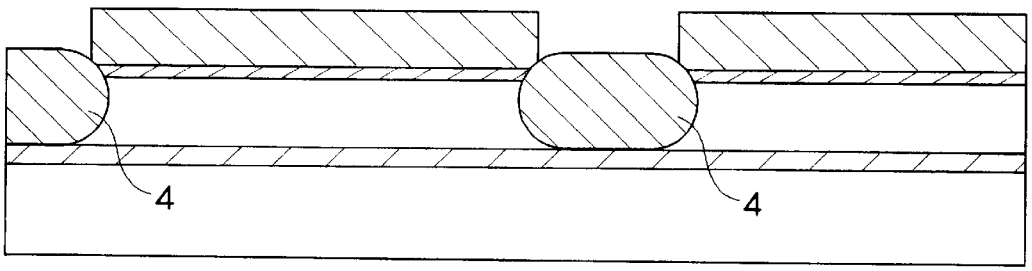
Figure 1D:
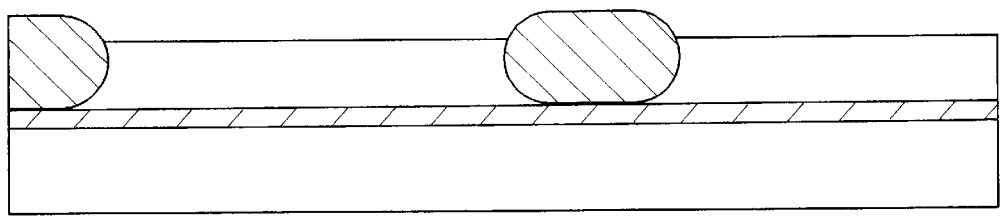
Figure 1E:
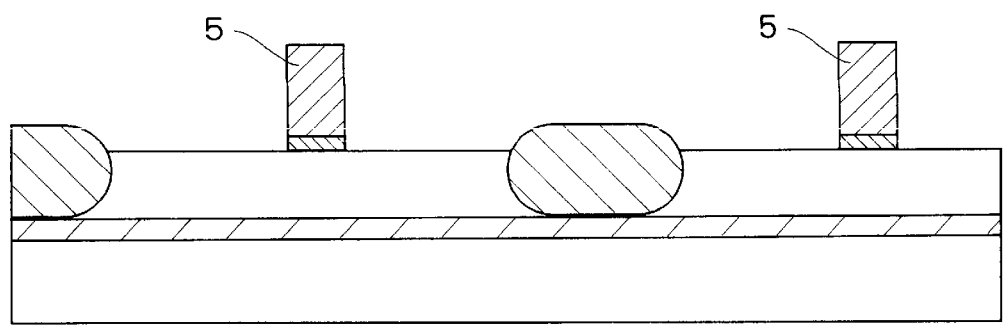
Figure 1F:
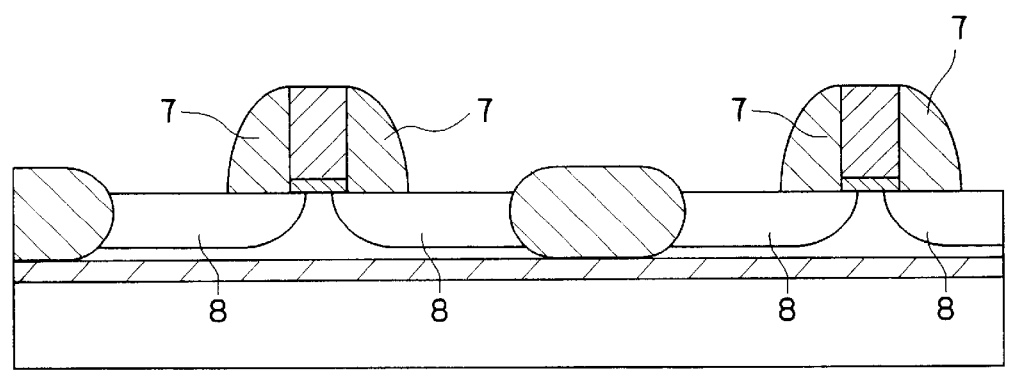
Figure 2A:
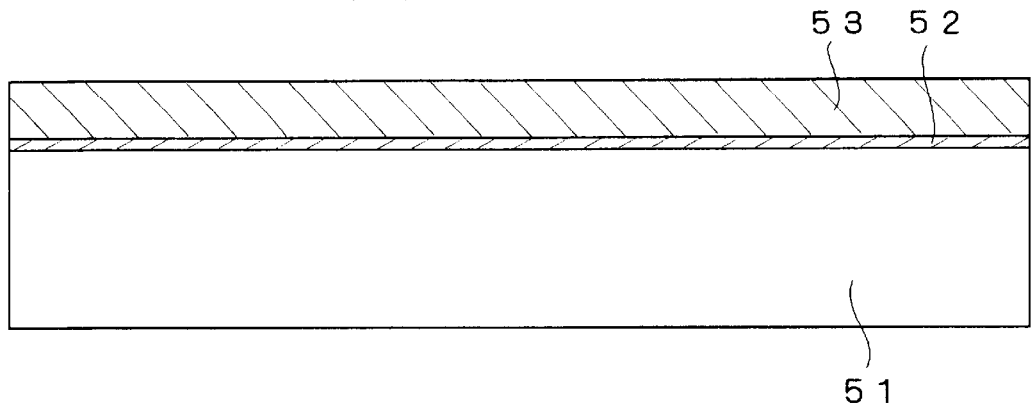
FIGS. 2A–2F illustrate a conventional process for fabricating a semiconductor device.
Figure 2B:
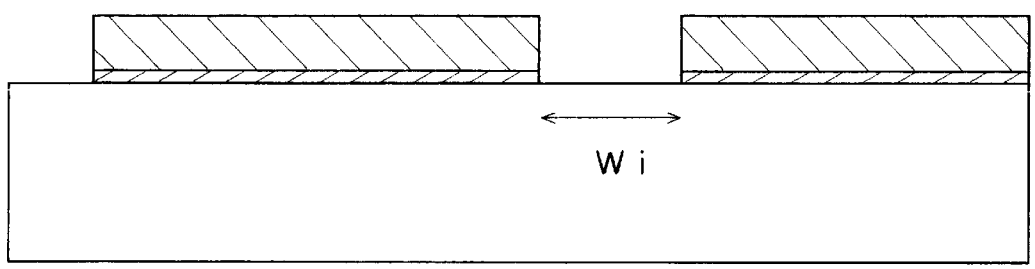
Figure 2C:
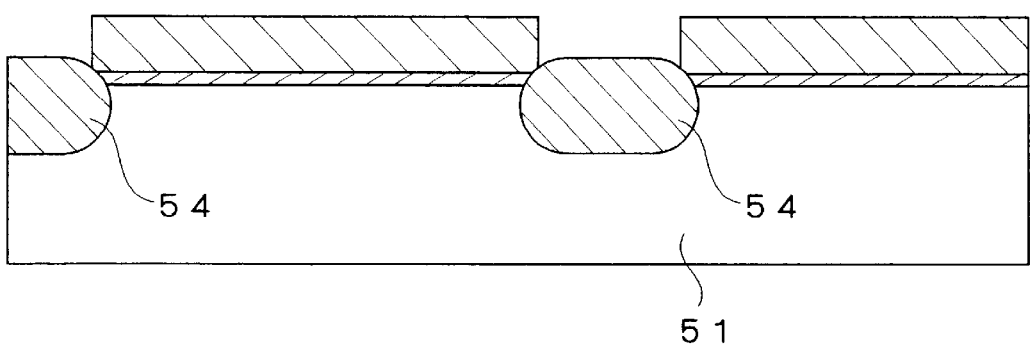
Figure 2D:
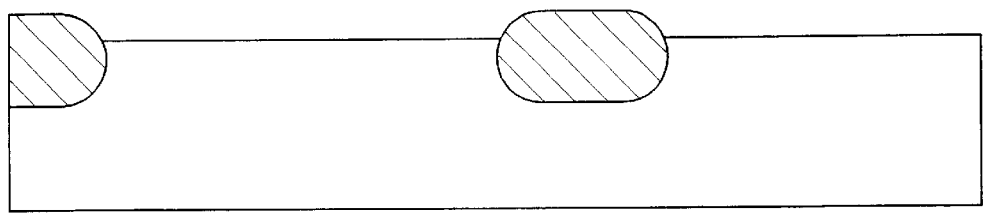
Figure 2E:
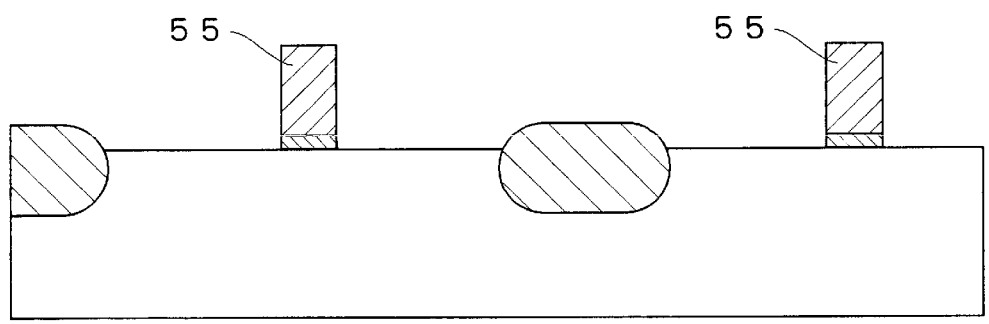
Figure 2F:
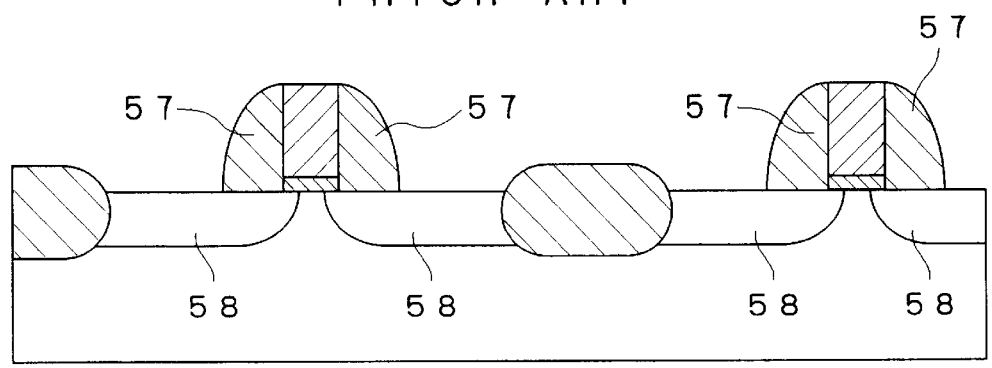

The Ar ions are implanted into the field oxidation regions of the SOI substrate, but do not reach the SOI substrate at regions where the active nitride films are provided as masks. Therefore, defects in the substrate at regions where devices are to be mounted, which defects might have harmful effects on the electric characteristics of the devices, can be avoided. The regions of the substrate where the Ar ions are implanted become amorphous. Thus, stress generated at the time of forming the openings for the field oxidation regions in the step a) is relieved. As a result, the regions of the substrate where the Ar ions are implanted are easy to oxidize.

c) Field oxide films 4, which will electrically separate adjacent devices, are formed on the SOI substrate 1 by dry oxidation (see FIG. 1C).

d) Remaining portions of the active nitride film 3 and the pad oxide film 2 are removed (see FIG. 1D).

e) Gate electrodes 5 are provided by a conventional process for fabricating MOSFETs (see FIG. 1E).

f) SiO$_2$ side walls 7 are formed by first providing an SiO$_2$ film on the substrate and then etching back. Impurities are then introduced into the substrate by means of ion implantation to form source/drain regions 8. Finally, the impurities in the source/drain regions 8 are activated by RTA, and MOSFETs with low source/drain resistance are obtained (see FIG. 1F).

As described above, in the present method of fabricating the MOSFET, after the openings which define the field oxidation regions are formed, the SOI substrate is irradiated with Ar ions. Thus only regions of the substrate that are to become the field oxidation regions become amorphous, whereby the stress generated at the time of forming the openings is relieved. The regions of the substrate where the Ar ions are implanted are easier to oxidize than in a case in which no Ar ions are implanted, because those regions have become amorphous and the stress within those regions has been relieved. Consequently, field oxide films having sufficient thickness can be obtained by the dry oxidation.

In the present embodiment, oxide films which are thicker than conventional ones can be obtained by the dry oxidation even under conventional oxidation conditions of, for example, temperature and time. It is therefore unnecessary to increase the oxidizing temperature or to lengthen the oxidizing time.

To significantly reduce stresses generated within the substrate, the thickness of the nitride film may be reduced. However, if the ion implantation energy is too great, the ions will penetrate the nitride film and reach the regions of the substrate where the devices are to be formed, which may cause defects in the substrate and thus deterioration in the electric characteristics of the devices. Further, if the implanted ions reach a so-called buried oxide in the SOI substrate, current may flow through the buried oxide and cause insufficient device isolation. However, such problems can be avoided when the oxide film and the nitride film of the thicknesses given herein are used, and the ion implantation is conducted at a relatively low implantation energy as described above.

Meanwhile, when a FET is formed in an SOI substrate, it is necessary to reduce the thickness of the substrate to several tens of nanometers. Accordingly, the thickness of the field oxide film and also that of the nitride film can be reduced. Thus, the field oxide films of sufficient thickness can be provided even if the implantation energy of the Ar ions is low.

By the above-described processes, satisfactorily narrow device isolation regions for the MOSFETs can be formed.

Second Embodiment

In the second embodiment of the present invention, instead of the Ar ions, Si ions are implanted into the regions of the SOI substrate where the openings which define the field oxidation regions are formed as in the first embodiment. That is, Si ions are irradiated onto the entire surface of the SOI substrate in the step shown in FIG. 1B. Other steps are the same as those of the first embodiment.

In the present embodiment, the stresses in the regions of the substrate where the openings which define the field oxidation regions have been formed are relieved by the implanted Si ions, and those regions become amorphous. Therefore, as in the first embodiment, the amount of oxidation during the field oxidation is increased.

Further, in the present embodiment, because Si ions are implanted into the SOI substrate, only SiO$_2$ will be introduced into the field oxide film during ion implantation. Thus, since no impurities are introduced, an oxide film of high quality is obtained.

Although the above-described embodiments have been explained for implanting Ar ions and Si ions into the regions of the Si substrate where the openings which define the field oxidation regions have been formed, the present invention is not limited thereto. Other ions may be employed as long as the same effect is obtained.

The present invention is also applicable to MOSFETs fabricated by means of "framed LOCOS," in which frames are provided on side walls of the openings which define the field oxidation regions.

What is claimed is:

1. A method of fabricating a MOSFET, comprising:
   (a) preparing an SOI substrate;
   (b) depositing an oxide film on the SOI substrate;
   (c) depositing a nitride film on the oxide film;
   (d) forming an opening in the nitride film and the oxide film at a predetermined region, at which a device isolation region is to be formed, by lithography for exposing a surface of the SOI substrate;
   (e) irradiating substantially an entire area of the exposed surface of the SOI substrate with Ar ions;
   (f) forming a field oxide film in the exposed surface by dry oxidation, after said irradiating; and
   (g) removing remaining portions of the nitride film and the oxide film.

2. The method of claim 1, wherein the oxide film comprises a thickness of 5 to 10 nm.

3. The method of claim 1, wherein the nitride film comprises a thickness of 50 to 150 nm.

4. The method of claim 1, wherein the step of irradiating with Ar ions comprises using an ion implantation apparatus under conditions including an implantation energy of 40 to 50 keV, an implantation angle of 0°, and an implantation dose of $1 \times 10^{14}$ to $5 \times 10^{15}$ cm$^{-2}$.

5. The method of claim 1, further comprising:
   (a) forming a gate electrode;
   (b) introducing impurities into the substrate by an ion implantation technique to form source and drain regions;
   (c) forming an interlayer insulating layer; and
   (d) forming wiring.

6. A method of fabricating a MOSFET, comprising:
   (a) preparing an SOI substrate;
   (b) depositing an oxide film on the SOI substrate;
   (c) depositing a nitride film on the oxide film;
   (d) forming an opening in the nitride film and the oxide film at a predetermined region, at which a device isolation region is to be formed, by lithography for exposing a surface of the SOI substrate;
   (e) irradiating substantially an entire area of the exposed surface of the SOI substrate with Si ions;
   (f) forming a field oxide film in the exposed surface by dry oxidation, after said irradiating; and
   (g) removing remaining portions of the nitride film and the oxide film.

7. The method of claim 6, wherein the oxide film comprises a thickness of 5 to 10 nm.

8. The method of claim 6, wherein the nitride film comprises a thickness of 50 to 150 nm.

9. The method of claim 6, wherein the step of irradiating with Si ions comprises using an ion implantation apparatus under conditions including an implantation energy of 40 to 50 keV, an implantation angle of 0°, and an implantation dose of $1 \times 10^{14}$ to $5 \times 10^{15}$ cm$^{-2}$.

10. The method of claim 6, further comprising:
    (a) forming a gate electrode;
    (b) introducing impurities into the substrate by an ion implantation technique to form source and drain regions;
    (c) forming an interlayer insulating layer; and
    (d) forming wiring.

11. A method for fabricating a MOSFET, comprising:
    (a) preparing an SOI substrate having a structure of silicon layer/buried oxide/substrate;
    (b) depositing an oxide film on the SOI substrate;
    (c) depositing a nitride film on the oxide film;
    (d) forming an opening in the nitride film and the oxide film at a predetermined region, at which a device isolation region is to be formed, by lithography for exposing a surface of the SOI substrate;
    (e) irradiating substantially an entire area of the exposed surface of the SOI substrate with at least one of Ar ions and Si ions, for implanting the at least one of Ar ions and Si ions into the silicon layer of the exposed surface of the SOI substrate, using the nitride film and the oxide film as a mask;
    (f) forming a field oxide film in the exposed surface by dry oxidation, after said irradiating; and
    (g) removing remaining portions of the nitride film and the oxide film.

12. The method of claim 11, wherein the oxide film comprises a thickness of 5 to 10 nm.

13. The method of claim 11, wherein the nitride film comprises a thickness of 50 to 150 nm.

14. The method of claim 11, wherein the step of irradiating with at least one of Ar ions and Si ions comprises using an ion implantation apparatus under conditions including an implantation energy of 40–50 keV, an implantation angle of 0°, and an implantation dose of $1 \times 10^{14}$ to $5 \times 10^{15}$ cm$^{-2}$.

15. The method of claim 14, wherein the thickness of the silicon layer is 30–100 nm.

16. The method of claim 11, further comprising:
    (a) forming a gate electrode;
    (b) introducing impurities into the substrate by an ion implantation technique to form source and drain regions;
    (c) forming an interlayer insulating layer; and
    (d) forming wiring.

* * * * *

UNITED STATES PATENT AND TRADEMARK OFFICE
CERTIFICATE OF CORRECTION

PATENT NO.     : 6,727,147 B2
DATED          : April 27, 2004
INVENTOR(S)    : Toshiyuki Nakamura et al.

It is certified that error appears in the above-identified patent and that said Letters Patent is hereby corrected as shown below:

Columns 5 and 6,
Delete in their entirety.

Signed and Sealed this

Third Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,727,147 B2
DATED : April 27, 2004
INVENTOR(S) : Toshiyuki Nakamura et al.

It is certified that error appears in the above-identified patent and that said Letters Patent is hereby corrected as shown below:

Columns 5 and 6,
Should be reinserted (as deleted by Certificate of Correction issued August 3, 2004).

Signed and Sealed this

Sixteenth Day of November, 2004

JON W. DUDAS
*Director of the United States Patent and Trademark Office*

UNITED STATES PATENT AND TRADEMARK OFFICE
CERTIFICATE OF CORRECTION

PATENT NO.    : 6,727,147 B2
DATED         : April 27, 2004
INVENTOR(S)   : Toshiyuki Nakamura et al.

It is certified that error appears in the above-identified patent and that said Letters Patent is hereby corrected as shown below:

Column 5,
Delete lines 10-24 and insert:
1. A method of fabricating a MOSFET, comprising:
    (a) preparing a substrate having an insulating layer and a silicon layer on the insulating layer;
    (b) depositing an oxide film on the substrate;
    (c) depositing a nitride film on the oxide film;
    (d) forming an opening in the nitride film and the oxide film at a predetermined region, at which a device isolation region is to be formed, by lithography for exposing a surface of the substrate;
    (e) irradiating substantially an entire area of the exposed surface of the substrate with Ar ions;
    (f) forming a field oxide film in the exposed surface by dry oxidation, after said irradiating; and
    (g) removing remaining portions of the nitride film and the oxide film.

Delete lines 41-56 and insert:
    6. A method of fabricating a MOSFET, comprising:
    (a) preparing a substrate having an insulating layer and a silicon layer on the insulating layer;
    (b) depositing an oxide film on the substrate;
    (c) depositing a nitride film on the oxide film;
    (d) forming an opening in the nitride film and the oxide film at a predetermined region, at which a device isolation region is to be formed, by lithography for exposing a surface of the substrate;
    (e) irradiating substantially an entire area of the exposed surface of the substrate with Si ions;
    (f) forming a field oxide film in the exposed surface by dry oxidation, after said irradiating; and
    (g) removing remaining portions of the nitride film and the oxide film.

Column 6,
Delete lines 16-39 and insert:
    11. A method for fabricating a MOSFET, comprising:
    (a) preparing a substrate having at least a silicon layer and an insulating layer under the silicon layer;
    (b) depositing an oxide film on the substrate;
    (c) depositing a nitride film on the oxide film;
    (d) forming an opening in the nitride film and the oxide film at a predetermined region, at which a device isolation region is to be formed, by lithography for exposing a surface of the substrate;

UNITED STATES PATENT AND TRADEMARK OFFICE
CERTIFICATE OF CORRECTION

PATENT NO. : 6,727,147 B2
DATED : April 27, 2004
INVENTOR(S) : Toshiyuki Nakamura et al.

It is certified that error appears in the above-identified patent and that said Letters Patent is hereby corrected as shown below:

Column 6 (cont'd),
    (e) irradiating substantially an entire area of the exposed surface of the substrate with at least one of Ar ions and Si ions, for implanting the at least one of Ar ions and Si ions into the silicon layer of the exposed surface of the substrate, using the nitride film and the oxide film as a mask;
    (f) forming a field oxide film in the exposed surface by dry oxidation, after said irradiating; and
    (g) removing remaining portions of the nitride film and the oxide film.

After line 55, add claims 17, 18, and 19:
17. The method of claim 1, wherein the substrate is an SOI substrate.

18. The method of claim 6, wherein the substrate is an SOI substrate.

19. The method of claim 11, wherein the substrate is an SOI substrate.

Signed and Sealed this

Fourteenth Day of March, 2006

JON W. DUDAS
*Director of the United States Patent and Trademark Office*